US011101811B2

(12) United States Patent
Gadgil et al.

(10) Patent No.: US 11,101,811 B2
(45) Date of Patent: *Aug. 24, 2021

(54) SYSTEMS AND METHODS FOR TESTING ANALOG TO DIGITAL (A/D) CONVERTER WITH BUILT-IN DIAGNOSTIC CIRCUIT WITH USER SUPPLIED VARIABLE INPUT VOLTAGE

(71) Applicant: Texas Instruments Incorporated, Dallas, TX (US)

(72) Inventors: Kaustubh Gadgil, Plano, TX (US); Rahul Vijay Kulkarni, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/706,399

(22) Filed: Dec. 6, 2019

(65) Prior Publication Data

US 2021/0175891 A1 Jun. 10, 2021

(51) Int. Cl.
*H03M 1/10* (2006.01)
*H03M 1/44* (2006.01)
(Continued)

(52) U.S. Cl.
CPC ....... *H03M 1/1071* (2013.01); *H03M 1/1245* (2013.01); *H03M 1/26* (2013.01);
(Continued)

(58) Field of Classification Search
CPC ...... H03M 1/1071; H03M 1/001; H03M 1/12; H03M 1/00
(Continued)

(56) References Cited

U.S. PATENT DOCUMENTS 4,679,028 A 7/1987 Wilson et al.
4,982,194 A 1/1991 Bacrania
(Continued)

FOREIGN PATENT DOCUMENTS

JP 2017069854 4/2017

OTHER PUBLICATIONS

International Search Report in corresponding PCT Application No. PCT/US2020/021344, dated Jun. 11, 2020 (2 pages).

*Primary Examiner* — Joseph J Lauture
(74) *Attorney, Agent, or Firm* — John R. Pessetto; Charles A. Brill; Frank D. Cimino

(57) ABSTRACT

A method for testing an A/D converter with a built-in diagnostic circuit with a user supplied variable input voltage includes generating a charge by a binary-weighted capacitor array responsive to an external voltage and a user specified code. The method further includes applying the charge to a first input of a voltage comparator and applying a bias voltage to a second input of the voltage comparator, and generating, by the voltage comparator, a comparison voltage responsive to the applied charge and the bias voltage. The method also includes applying the comparison voltage to an input of a successive approximation register and generating, by the successive approximation register, an approximate digital code responsive to the comparison voltage. The method also includes determining if at least one bit of the approximate digital code fails to toggle independent of adjacent bits.

20 Claims, 2 Drawing Sheets

(51) Int. Cl.
*H03M 1/12* (2006.01)
*H03M 1/36* (2006.01)
*H03M 1/26* (2006.01)
*H03M 1/00* (2006.01)

(52) U.S. Cl.
CPC ........... *H03M 1/361* (2013.01); *H03M 1/442* (2013.01); *H03M 1/00* (2013.01); *H03M 1/001* (2013.01); *H03M 1/12* (2013.01)

(58) Field of Classification Search
USPC ...................... 341/120, 110, 155, 163, 126
See application file for complete search history.

(56) References Cited

U.S. PATENT DOCUMENTS

| | | | |
|---|---|---|---|
| 6,268,813 | B1 | 7/2001 | de Witt |
| 7,158,070 | B1* | 1/2007 | Yang ................... H03M 1/1019 341/155 |
| 8,633,844 | B2 | 1/2014 | Piasecki |
| 8,754,798 | B2 | 6/2014 | Lin |
| 9,853,655 | B1 | 12/2017 | Pernull et al. |
| 9,893,739 | B2 | 2/2018 | Bode |
| 9,960,777 | B2 | 5/2018 | Duryea et al. |
| 10,079,609 | B2 | 9/2018 | Fan |
| 2013/0249723 | A1 | 9/2013 | Dey et al. |
| 2018/0191365 | A1 | 7/2018 | Zanikopoulos et al. |

\* cited by examiner

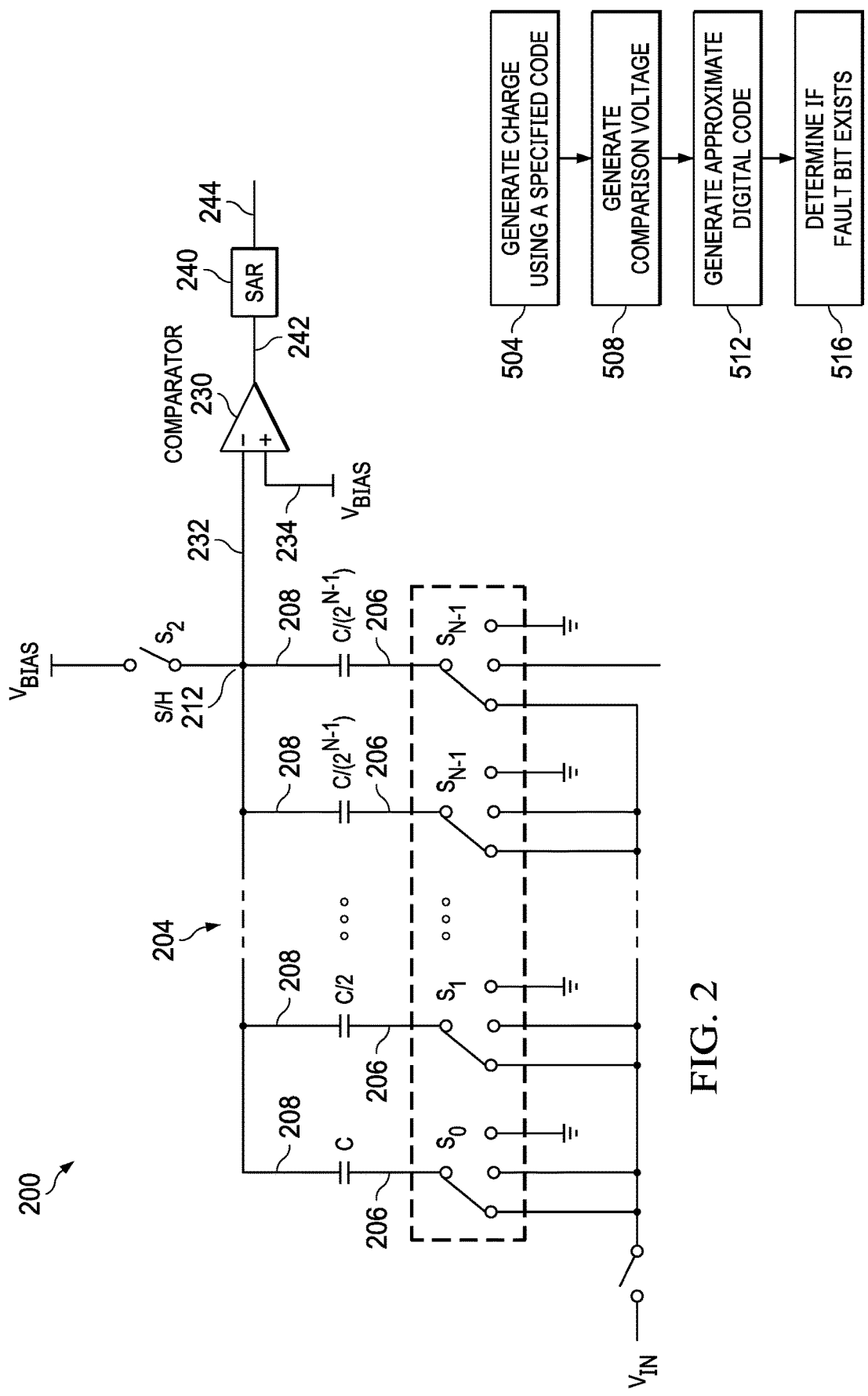

SYSTEMS AND METHODS FOR TESTING ANALOG TO DIGITAL (A/D) CONVERTER WITH BUILT-IN DIAGNOSTIC CIRCUIT WITH USER SUPPLIED VARIABLE INPUT VOLTAGE

BACKGROUND

The disclosure generally relates generally to analog to digital (A/D) converters, and more particularly to systems and methods for testing an A/D converter with a built-in diagnostic circuit with a user supplied variable input voltage.

DESCRIPTION OF THE RELATED ART

In safety/critical applications, analog input (AI) modules are used to measure parameters such as temperature, pressure, voltage level, air quality, etc. The AI modules output control signals responsive to input parameters, and the control signals are converted to digital code by analog to digital (A/D) converters. Since detecting faults in AI modules is desired in safety/critical applications, it is essential to ensure that output bits of an A/D converter toggle independent of adjacent bits. If one or more output bits of an A/D converter fail to toggle independent of adjacent bits, the A/D converter is not suitable for use.

FIG. 1 illustrates an external test circuit 100 used to test an A/D converter 104. During a normal operating mode, analog signal generated by an AI module 108 is multiplexed by a 2:1 multiplexer 112 to the A/D converter 104 which generates a digital code representative of the analog signal. During a test mode, a digital to analog (D/A) converter 116 generates a test signal responsive to a digital code. Noise generated by a generator 120 can be added to the test signal at a summer 124. The test signal with the added noise is multiplexed by the multiplexer 112 to the A/D converter 104. The test signal is varied by changing the 10 bit code, and the output of the A/D converter 104 is examined to ensure all output bits of the A/D converter 104 toggle independent of adjacent bits.

The external test circuit 100 has several drawbacks. The external test circuit 100 requires PCB area and adds a failure mode in safety/critical systems. Also, since AI modules for safety/critical applications are typically designed with isolated input channels for increased reliability, multiple instances of the external test circuit are required for the isolated input channels.

SUMMARY

Various aspects of the present disclosure are directed to systems and methods for testing an A/D converter with a built-in diagnostic circuit with a user supplied variable input voltage. In one aspect, a method includes generating a charge by a binary-weighted capacitor array responsive to an external input voltage and a user specified code. The method further includes applying the charge to a first input of a voltage comparator and applying a bias voltage to a second input of the voltage comparator, and generating, by the voltage comparator, a comparison voltage responsive to the applied charge and the bias voltage. The method also includes applying the comparison voltage to an input of a successive approximation register and generating, by the successive approximation register, an approximate digital code responsive to the comparison voltage. The method also includes determining if at least one bit of the approximate digital code fails to toggle independent of adjacent bits.

In an additional aspect of the present disclosure, the A/D converter includes a capacitor array having respective first terminals selectively coupled to an external input voltage or ground via a plurality of first switches and having respective second terminals coupled to a sample and hold (S/H) output, wherein the S/H output is selectively coupled to a bias voltage via a second switch. The A/D converter further includes a voltage comparator having a first input coupled to the S/H output and having a second input coupled to the bias voltage. The voltage comparator is configured to output a comparison voltage responsive to a sampled charge at the S/H output and the bias voltage. The A/D converter also includes a successive approximation register coupled to receive the comparison voltage and configured to output an approximate digital code responsive to the comparison voltage. The approximate digital code is varied by controlling an equivalent capacitance of the capacitor array.

In an additional aspect of the disclosure, the capacitor array comprises a plurality of switched binary-weighted capacitors. The sampled charge at the S/H output is controlled by varying the number of switched binary-weighted capacitors.

In an additional aspect of the disclosure, the equivalent capacitance is increased by increasing the number of switched binary-weighted capacitors interconnected in parallel, and the equivalent capacitance of the capacitor array is decreased by reducing the number of switched binary-weighted capacitors interconnected in parallel.

In an additional aspect of the disclosure, the S/H output is coupled to the bias voltage via the second switch during a sample phase and is de-coupled from the bias voltage during a hold phase.

In an additional aspect of the disclosure, during the sample phase both the first and second inputs of the voltage comparator are coupled to the bias voltage, and during the hold phase the second input of the voltage comparator is coupled to the bias voltage and the first input of the voltage comparator is not coupled to the bias voltage.

In an additional aspect of the disclosure, during the hold phase the first input of the voltage comparator is coupled to the S/H output and the second input of the voltage comparator is coupled to the bias voltage.

In an additional aspect of the disclosure, a fault bit is diagnosed if at least one bit of the approximate digital code fails to toggle when the ratio is varied.

In an additional aspect of the disclosure, an A/D converter with an internal diagnostic circuit includes a capacitor array having respective first terminals selectively coupled to an external input voltage or ground via a plurality of first switches and having respective second terminals coupled to a sample and hold (S/H) output, wherein the S/H output is selectively coupled to a bias voltage via a second switch during a sample phase and is de-coupled from the bias voltage via the second switch during a hold phase. The A/D converter also includes a voltage comparator having a first input coupled to the S/H output and having a second input coupled to the bias voltage. The voltage comparator is configured to output a comparison voltage responsive to a sampled charge at the S/H output and the bias voltage. The A/D converter also includes a successive approximation register coupled to receive the comparison voltage and configured to output an approximate digital code responsive to the comparison voltage. During the sample phase both the first and second inputs of the voltage comparator are coupled to the bias voltage, and during the hold phase the second input of the voltage comparator is coupled to the bias voltage and the first input of the voltage comparator is not coupled to the bias voltage.

In an additional aspect of the disclosure, an A/D converter with an internal diagnostic circuit includes a capacitor array including a plurality of switched binary-weighted capacitors having respective first terminals selectively coupled to an external input voltage or ground via a plurality of first switches and having respective second terminals coupled to a sample and hold (S/H) output, wherein the S/H output is selectively coupled to a bias voltage via a second switch. The A/D converter also includes a voltage comparator having a first input coupled to the S/H output and having a second input coupled to the bias voltage. The voltage comparator is configured to output a comparison voltage responsive to a sampled charge at the S/H output and the bias voltage. The A/D converter also includes a successive approximation register coupled to receive the comparison voltage and configured to output an approximate digital code responsive to the comparison voltage. During a sample phase the second switch couples the S/H output to the bias voltage and during a hold phase the second switch decouples the S/H output from the bias voltage, and during the sample phase both the first and second inputs of the voltage comparator are coupled to the bias voltage, and during the hold phase the second input of the voltage comparator is coupled to the bias voltage and the first input of the voltage comparator is not coupled to the bias voltage.

BRIEF DESCRIPTION OF THE DRAWINGS

FIG. 2 is a schematic of an A/D converter in accordance with an exemplary embodiment.

FIG. 5 is a block diagram of method steps executed in accordance with an exemplary embodiment.

DETAILED DESCRIPTION

Figure 1:
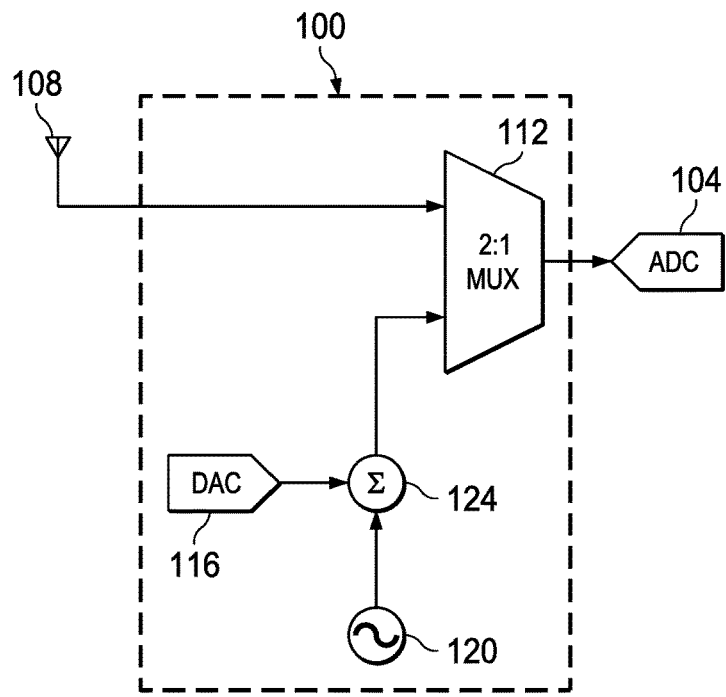
FIG. 1 shows an external test circuit used to test an A/D converter.

Reference will now be made in detail to the embodiments, examples of which are illustrated in the accompanying drawings, in which some, but not all embodiments are shown. Indeed, the concepts may be embodied in many different forms and should not be construed as limiting herein. Rather, these descriptions are provided so that this disclosure will satisfy applicable requirements.

FIG. 2 is a schematic of an analog to digital (A/D) converter 200 in accordance with an exemplary embodiment. The A/D converter 200 has a built-in diagnostic circuit which provides a controlled voltage source that is used test output bits of the A/D converter 200, thereby eliminating a need for an external test circuit. The A/D converter 200 with the built-in diagnostic circuit can be implemented as an integrated circuit (IC) and used in safety/critical applications where high availability is desired.

With reference to FIG. 2, the A/D converter 200 includes a capacitor array 204 which includes a plurality of capacitors having respective first terminals 206 and second terminals 208. In an exemplary embodiment, the capacitor array 204 is formed with a plurality of switched binary-weighted capacitors (e.g., C, C/2, C/4, . . . ). The A/D converter 200 also includes first switches S0-SN−1 configured to selectively couple the first terminals 206 of the capacitor array 204 to a variable input voltage Vin or ground. The variable input voltage Vin (external input voltage) can be supplied by a user outside the IC. The variable input voltage Vin can be varied between a minimum voltage level (e.g., 0.5V) to a maximum voltage level (e.g., 5V). The second terminals 208 of the capacitor array 204 are coupled to a sample and hold (S/H) output 212. The A/D converter 200 also includes a second switch S2 configured to selectively couple the S/H output 212 to a bias voltage Vbias.

With continuing reference to FIG. 2, the A/D converter 200 also includes a voltage comparator 230 having a first input 232 coupled to the S/H output 212 and a second input 234 coupled to a bias voltage Vbias. The voltage comparator 230 is configured to output a comparison voltage responsive to a sampled charge at the S/H output 212 and the bias voltage Vbias.

In an exemplary embodiment, the sampled charge at the S/H output 212 can be varied by the number of switched binary-weighted capacitors coupled to the input voltage Vin. Some or all of the binary weighted capacitors' first terminals 206 can be connected to the input voltage Vin, and some or all of the binary weighted capacitors' first terminals 206 can be connected to ground.

With continuing reference to FIG. 2, the A/D converter 200 also includes a successive approximation register (SAR) 240 having an input 242 coupled to receive the comparison voltage. The SAR 240 is configured to generate an approximate digital code at an output 244 responsive to the comparison voltage. The approximate digital code is a digital representation of the diagnostic test voltage at the S/H output 212. The approximate digital code is varied by controlling an equivalent capacitance of the capacitor array 204. In an exemplary embodiment, the SAR 240 applies a binary search algorithm to output the approximate digital code.

With continuing reference to FIG. 2, the equivalent capacitance of the capacitor array 204 can be controlled by varying the number of binary-weighted capacitors interconnected in parallel. By increasing the number of binary-weighted capacitors interconnected in parallel, and the equivalent capacitance of the capacitor array 204 is increased, and by reducing the number of binary-weighted capacitors interconnected in parallel, the equivalent capacitance of the capacitor array 204 is decreased.

With continuing reference to FIG. 2, during a sample phase the first terminals 206 of the capacitor array 204 are selectively connected by closing the switches, S0-SN−1, to either the input voltage Vin or ground. Also, during the sample phase, the second switch S2 is closed to couple the S/H output 212 to the bias voltage Vbias. Thus, during the sample phase both the first and second inputs 232, 234 of the voltage comparator 230 are coupled to the bias voltage Vbias. The capacitor array 204 is charged by the input voltage Vin and has a charge equal to the capacitance multiplied by the input voltage Vin. The sampled charge is equal to $(Vin) \times (\Sigma Cn)$, where Cn are switched-binary-weighted capacitors connected to Vin.

Next, during a hold (or conversion) phase, the switch S2 is opened to de-couple the S/H output 212 from the bias voltage Vbias. As a consequence, during the hold (or conversion) phase, although the first input 232 of the voltage comparator 230 is de-coupled from the bias voltage Vbias, the first input 232 remains coupled to the S/H output 212 and the second input 234 remains coupled to the bias voltage Vbias. The voltage comparator 230 outputs the comparison voltage responsive to the sampled charge at the S/H output 212 and the bias voltage Vbias. The comparison voltage is applied to the input 242 of the SAR 240. The SAR 240 applies a binary search algorithm to the comparison voltage and outputs the approximate digital code which is a digital representation of the S/H voltage. The SAR 240 can be realized in hardware or software.

In an aspect of the present disclosure, the sampled charge at the S/H output 212 can be varied by varying the input voltage Vin. Additionally, the sampled charge at the S/H output 212 can be varied by varying the equivalent capacitance of the capacitor array 204. Thus, a wide range of sampled charge is available to test the A/D converter 200.

Figure 3:
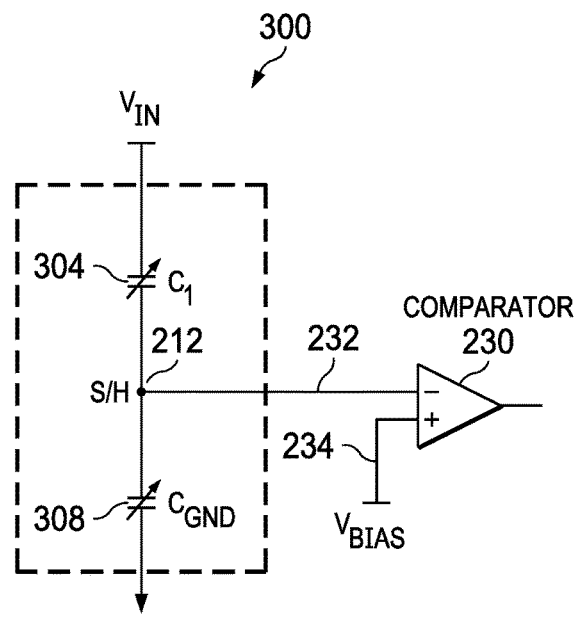
FIG. 3 illustrates a simplified equivalent circuit.

FIG. 3 illustrates a simplified equivalent circuit during the hold (or conversion) phase. The first input 232 of the voltage comparator 230 is de-coupled from the bias voltage Vbias. However, the first input 232 of the voltage comparator 230 remains coupled to the S/H output 212 and the second input 234 remains coupled to the bias voltage Vbias. A capacitor array 304 comprising a plurality of switched binary-weighted capacitors are coupled to the input voltage Vin. The sampled charge at the S/H output 212 is controlled by varying the number of capacitors in the array. A selected number of capacitors are coupled to ground.

Figure 4:
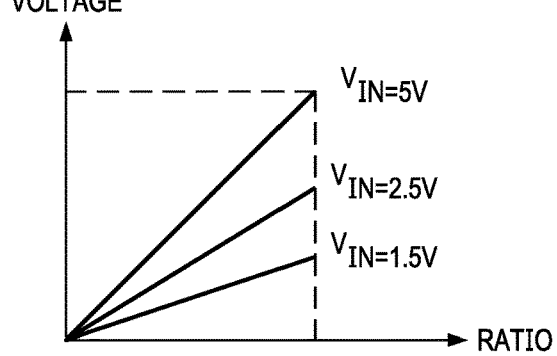
FIG. 4 illustrates voltage sampled by a comparator.

FIG. 4 illustrates the S/H voltage sampled by the comparator 230. By using a user supplied variable input voltage and a code to vary the equivalent capacitance of the capacitor array, the sampled charge at the S/H output 212 can be varied to test the approximate digital code produced by the SAR 240. As the sampled charge is varied using the code, if at least one of the bits of the approximate digital code fails to toggle independent of adjacent bits, a determination is made that A/D converter 200 has at least one fault bit, which may render the A/D converter 200 unsuitable for safety/critical applications where high availability is desired.

FIG. 5 is a block diagram of method steps executed in accordance with an exemplary embodiment. In block 504, a charge is generated by a binary-weighted capacitor array responsive to an external voltage and a user specified code. In block 508, the charge is applied to a first input of a voltage comparator and a bias voltage is applied to a second input of the voltage comparator, and a comparison voltage is generated responsive to the applied charge and the bias voltage.

In block 512, the comparison voltage is applied to an input of a successive approximation register and an approximate digital code is generated responsive to the comparison voltage. In block 516, a fault bit is determined by determining if at least one bit of the approximate digital code fails to toggle independent of adjacent bits. The flow returns to block 504 where the process is repeated by varying the user specified code. Also as discussed before the user may vary varying the external voltage and determine if at least one bit of the approximate digital code fails to toggle independent of adjacent bits.

Various illustrative components, blocks, modules, circuits, and steps have been described above in general terms of their functionality. Whether such functionality is implemented as hardware or software depends upon the particular application and design constraints imposed on the overall system. The described functionality may be implemented in varying ways for each particular application, but such implementation decision should not be interpreted as causing a departure from the scope of the present disclosure.

For simplicity and clarity, the full structure and operation of all systems suitable for use with the present disclosure is not being depicted or described herein. Instead, only so much of a system as is unique to the present disclosure or necessary for an understanding of the present disclosure is depicted and described.

What is claimed is:

1. A method of testing an analog to digital (A/D) converter with a built-in diagnostic circuit, the method comprising:
generating a charge by a binary-weighted capacitor array responsive to an external voltage and a user specified code;
applying the charge to a first input of a voltage comparator and applying a bias voltage to a second input of the voltage comparator, and generating, by the voltage comparator, a comparison voltage responsive to the applied charge and the bias voltage;
applying the comparison voltage to an input of a successive approximation register and generating, by the successive approximation register, an approximate digital code responsive to the comparison voltage; and
determining if at least one bit of the approximate digital code fails to toggle independent of adjacent bits.

2. The method of claim 1, further comprising:
varying the user specified code; and
determining if at least one bit of the approximate digital code fails to toggle independent of adjacent bits responsive to the varying the user specified code, wherein a fault bit is detected if at least one bit fails to toggle independent of adjacent bits.

3. The method of claim 1, further comprising:
varying the external voltage; and
determining if at least one bit of the approximate digital code fails to toggle independent of adjacent bits responsive to the varying the external voltage, wherein a fault bit is detected if at least one bit fails to toggle independent of adjacent bits.

4. The method of claim 1, wherein the external voltage is generated outside of an integrated circuit.

5. The method of claim 1, further comprising:
applying the charge to the first input of the voltage comparator during a hold phase; and
removing the charge from the first input of the voltage comparator during a sample phase.

6. The method of claim 1, further comprising applying the bias voltage to both the first and second inputs of the voltage comparator during a sample phase.

7. The method of claim 1, further comprising varying an equivalent capacitance of the binary-weighted capacitor array by the user specified code.

8. The method of claim 1, wherein the successive approximation register applies a binary search algorithm to generate the approximate digital code.

9. An analog to digital (A/D) converter with an internal diagnostic circuit comprising:
a capacitor array having respective first terminals selectively coupled to an external input voltage or ground via a plurality of first switches and having respective second terminals coupled to a sample and hold (S/H) output, wherein the S/H output is selectively coupled to a bias voltage via a second switch during a sample phase and is de-coupled from the bias voltage via the second switch during a hold phase;
a voltage comparator having a first input coupled to the S/H output and having a second input coupled to the bias voltage, the voltage comparator configured to output a comparison voltage responsive to a sampled charge at the S/H output and the bias voltage; and
a successive approximation register configured to receive the comparison voltage and configured to output an approximate digital code responsive to the comparison voltage,
wherein during the sample phase both the first and second inputs of the voltage comparator are coupled to the bias voltage, and wherein during the hold phase the second input of the voltage comparator is coupled to the bias voltage and the first input of the voltage comparator is not coupled to the bias voltage.

10. The A/D converter of claim 9, wherein the capacitor array comprises a plurality of switched binary-weighted capacitors.

11. The A/D converter of claim 9, wherein the sampled charge at the S/H output is controlled by varying the number of switched binary-weighted capacitors connected to the external input voltage.

12. The A/D converter of claim 9, wherein an equivalent capacitance of the capacitor array is controlled by varying the number of switched binary-weighted capacitors connected in parallel.

13. The A/D converter of claim 12, wherein the equivalent capacitance of the capacitor array is increased by increasing the number of switched binary-weighted capacitors interconnected in parallel, and wherein the equivalent capacitance of the capacitor array is decreased by reducing the number of switched binary-weighted capacitors interconnected in parallel.

14. The A/D converter of claim 9, wherein a fault bit is diagnosed if at least one bit of the approximate digital code fails to toggle independent of adjacent bits when the ratio is varied.

15. The A/D converter of claim 9, wherein the external input voltage is generated inside an integrated circuit.

16. An analog to digital (A/D) converter with an internal diagnostic circuit comprising:
  a capacitor array comprising a plurality of switched binary-weighted capacitors having respective first terminals selectively coupled to an external input voltage or ground via a plurality of first switches and having respective second terminals coupled to a sample and hold (S/H) output, wherein the S/H output is selectively coupled to a bias voltage via a second switch;
  a voltage comparator having a first input coupled to the S/H output and having a second input coupled to the bias voltage, the voltage comparator configured to output a comparison voltage responsive to a sampled charge at the S/H output and the bias voltage; and
  a successive approximation register configured to receive the comparison voltage and configured to output an approximate digital code responsive to the comparison voltage,
  wherein during a sample phase the second switch couples the S/H output to the bias voltage and during a hold phase the second switch decouples the S/H output from the bias voltage, and wherein during the sample phase both the first and second inputs of the voltage comparator are coupled to the bias voltage, and wherein during the hold phase the second input of the voltage comparator is coupled to the bias voltage and the first input of the voltage comparator is not coupled to the bias voltage.

17. The A/D converter of claim 16, wherein an equivalent capacitance of the capacitor array is controlled by varying the number of switched binary-weighted capacitors connected in parallel.

18. The A/D converter of claim 17, wherein the equivalent capacitance of the capacitor array is increased by increasing the number of switched binary-weighted capacitors interconnected in parallel, and wherein the equivalent capacitance of the capacitor array is decreased by reducing the number of switched binary-weighted capacitors interconnected in parallel.

19. The A/D converter of claim 16, wherein a fault bit is diagnosed if at least one bit of the approximate digital code fails to toggle independent of adjacent bits when the ratio is varied.

20. The A/D converter of claim 16, wherein the successive approximation register applies a binary search algorithm to output the approximate digital code.

* * * * *